(12) United States Patent
Yu et al.

(10) Patent No.: US 9,093,561 B2
(45) Date of Patent: Jul. 28, 2015

(54) MODIFIED, ETCH-RESISTANT GATE STRUCTURE(S) FACILITATING CIRCUIT FABRICATION

(71) Applicant: GLOBALFOUNDRIES Inc., Grand Cayman, KY (US)

(72) Inventors: Hong Yu, Rexford, NY (US); Huang Liu, Mechanicville, NY (US); Lun Zhao, Ballston Lake, NY (US); Richard J. Carter, Saratoga Springs, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 23 days.

(21) Appl. No.: 14/085,906

(22) Filed: Nov. 21, 2013

(65) Prior Publication Data

US 2015/0140751 A1    May 21, 2015

(51) Int. Cl.
| | | |
|---|---|---|
| *H01L 21/8238* | (2006.01) | |
| *H01L 21/768* | (2006.01) | |
| *H01L 21/308* | (2006.01) | |
| *H01L 21/84* | (2006.01) | |

(52) U.S. Cl.
CPC ...... *H01L 21/823857* (2013.01); *H01L 21/308* (2013.01); *H01L 21/76829* (2013.01); *H01L 21/823821* (2013.01); *H01L 21/823864* (2013.01); *H01L 21/845* (2013.01)

(58) Field of Classification Search
CPC ............ H01L 21/308; H01L 21/76829; H01L 21/823821; H01L 21/82384; H01L 21/283857; H01L 21/283864; H01L 21/845; H01L 29/66545; H01L 29/78
See application file for complete search history.

(56) References Cited

U.S. PATENT DOCUMENTS

| | | | |
|---|---|---|---|
| 6,605,413 | B1 | 8/2003 | Lyons et al. |
| 8,039,391 | B1 | 10/2011 | Yin et al. |
| 8,431,455 | B2 | 4/2013 | van Bentum et al. |
| 2008/0001187 | A1* | 1/2008 | Booth et al. .................. 257/288 |
| 2012/0302023 | A1 | 11/2012 | Javorka et al. |
| 2013/0178024 | A1 | 7/2013 | Flachowsky et al. |

* cited by examiner

*Primary Examiner* — Thanhha Pham
(74) *Attorney, Agent, or Firm* — Naresh K. Kannan, Esq.; Heslin Rothenberg Farley & Mesiti, P.C.

(57) ABSTRACT

Circuit fabrication methods are provided which include, for example: providing the circuit structure with at least one gate structure extending over a first region and a second region of a substrate structure, the at least one gate structure including a capping layer; and modifying an etch property of at least a portion of the capping layer of the at least one gate structure, where the modified etch property inhibits etching of the at least one gate structure during a first etch process facilitating fabrication of at least one first transistor in the first region and inhibits etching of the at least one gate structure during a second etch process facilitating fabrication of at least one second transistor in the second region.

20 Claims, 7 Drawing Sheets

MODIFIED, ETCH-RESISTANT GATE STRUCTURE(S) FACILITATING CIRCUIT FABRICATION

FIELD OF THE INVENTION

The present invention relates to methods for facilitating fabrication of circuit structures, and more particularly, to methods for facilitating fabrication of circuit structures via modification of an etch property of one or more gate structures.

BACKGROUND OF THE INVENTION

Semiconductor device fabrication, such as transistor fabrication, typically involves several processing steps of patterning and etching to form the desired circuit structures. During each processing step, materials may be, for instance, deposited on, or etched from, a wafer. Because each step of a fabrication process may introduce delay, complexity, and cost, it may be desirable to seek to eliminate or decrease the scope of one or more steps in order to maximize fabrication efficiency and increase commercial advantage.

BRIEF SUMMARY

The shortcomings of the prior art are overcome, and additional advantages are provided, through the provision, in one aspect, of a method for facilitating fabricating a circuit structure. The facilitating fabricating includes: providing the circuit structure with at least one gate structure extending over a first region and a second region of a substrate structure, the at least one gate structure including a capping layer; and modifying an etch property of at least a portion of the capping layer of the at least one gate structure, wherein the modified etch property inhibits etching of the capping layer of the at least one gate structure during a first etch process facilitating fabrication of at least one first transistor in the first region and inhibits etching of the at least one gate structure during a second etch process facilitating fabrication of at least one second transistor in the second region.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, methods for facilitating fabrication of circuit structures. As part of this facilitating, an etch property of a gate structure is modified, so that the modified etch property of the gate structure resists or inhibits etching of the gate structure during fabrication of different circuit devices. The entire gate structure, which may include a capping layer over a sacrificial gate, may be exposed to multiple etch processes during, for instance, transistor device fabrication. If the capping layer has sufficient thickness, and the capping layer is fully exposed to the multiple etch processes it may be partially and uniformly thinned during these etch processes. However, if the entire gate structure is not exposed to all etch processes, an undesirable height-variation of the gate structure may result due, for instance, to certain portions of the capping layer being etched more or less than other portions of the capping layer.

Generally stated, provided herein, in one aspect, is a method for facilitating fabricating a circuit structure. The facilitating fabricating includes: providing the circuit structure with at least one gate structure extending over a first region and a second region of a substrate structure, the at least one gate structure including a capping layer; and modifying an etch property of at least a portion of the capping layer of the at least one gate structure, where the modified etch property inhibits etching of the at least one gate structure during a first etch process facilitating fabrication of at least one first transistor (such as at least one first conductivity-type transistor) in the first region and inhibits etching of the capping layer of the at least one gate structure during a second etch process facilitating fabrication of at least one second transistor (such as at least one second conductivity-type transistor) in the second region.

In one example, modifying the etch property of the at least the portion of the capping layer includes implanting at least one species of element or molecule into the capping layer to modify the etch property thereof. In such a case, the at least one species of element or molecule may be or include at least one of germanium, boron, phosphorous, oxygen, ozone, carbon, nitrogen, or arsenic. In another example, modifying the etch property of the at least the portion of the capping layer includes exposing the capping layer to a plasma to modify the etch property thereof. As one example, the plasma may include at least one of carbon or nitrogen. In a further example, modifying the etch property of the at least the portion of the capping layer may include exposing the capping layer to microwave radiation in the presence of a gaseous material to modify the etch property thereof. In this case, the gaseous material may be or include at least one of oxygen or nitrogen. In an alternate example, the modifying the etch property of the at least the portion of the capping layer may include annealing the capping layer in the presence of a gaseous material.

In one embodiment, the capping layer could be or include at least one of silicon oxide, silicon nitride, silicon oxycarbon nitride, silicon boron carbonitride, silicon oxynitride, silicon boron oxycarbon nitride, or silicon oxycarbide. In one specific example, the capping layer may be or include silicon nitride and the modifying the etch property of the at least the portion of the capping layer could include implanting germanium into an upper portion of the silicon nitride capping layer.

In a further embodiment, the at least one gate structure may further include a sacrificial gate and sidewall spacers, the sidewall spacers being adjacent to the sacrificial gate, with the capping layer overlying and protecting the sacrificial gate and the sidewall spacers. In one example, the first etch process could be or include a first anisotropic etching and the second etch process could be or include a second anisotropic etching. In addition, the method may further include removing the sacrificial gate subsequent to the first etch process and the second etch process, wherein the modified etch property of the capping layer facilitates maintaining planarity of the capping layer throughout the different regions, prior to the removing of the sacrificial gate, notwithstanding the different first and second etch processes in the different regions.

In another example, modifying the etch property of the at least the portion of the capping layer of the at least one gate structure may include: providing a protective mask extending over the at least one gate structure; recessing the protective mask to expose the capping layer of the at least one gate structure; modifying the etch property of the at least a portion of the capping layer of the at least one gate structure; and removing the protective mask. In such a case, the modifying the etch property of the at least the portion of the capping layer may include at least one of implanting at least one species of element or molecule into the capping layer, exposing the capping layer to a plasma, exposing the capping layer to microwave radiation in the presence of a gaseous material, or annealing the capping layer.

In an exemplary embodiment, the substrate structure may have or include multiple fins, the first region and the second region may include different regions of the multiple fins, and the at least one first transistor in the first region may be (or include) at least one first fin-type transistor, and the at least one second transistor in the second region may be (or include) at least one second fin-type transistor. In such an embodiment, providing the circuit structure may further include providing a fin protect layer over the multiple fins, the fin protect layer and the capping layer being or including a common material susceptible to the first and second etch processes, and modifying the etch property of the at least the portion of the capping layer may include modifying the etch property of the at least the portion of the capping layer without effecting an etch property of the fin protect layer over the multiple fins, where the modified portion of the capping layer protects the at least one gate structure during the first and second etch processes, and the protective layer over the multiple fins remains susceptible to the first and second etch processes, for instance to facilitate fabrication of the different transistors in the different regions of the substrate structure. In this example, the fabrication of the first fin-type transistor may include: performing the first etch process to remove a portion of the fin protect layer to reveal a portion of the multiple fins in the first region; and growing at least one embedded stress element from the portion of the multiple fins in the first region.

In another embodiment, the at least one gate structure may include a boundary portion overlapping the first region and the second region, and the first etch process may include, prior to etching, providing a protective layer over the second region of the circuit structure and the boundary portion of the at least one gate structure, and the second etch process may include, prior to etching, providing another protective layer over the first region of the circuit structure and the boundary portion of the at least one gate structure. In this example, the modified etch property of the capping layer facilitates maintaining planarity of the capping layer, including within the boundary portion, notwithstanding the different first and second etch processes.

Reference is made below to the drawings, which are not drawn to scale for ease of understanding, wherein the same reference numbers used throughout different figures designate the same or similar components.

Figure 1A:
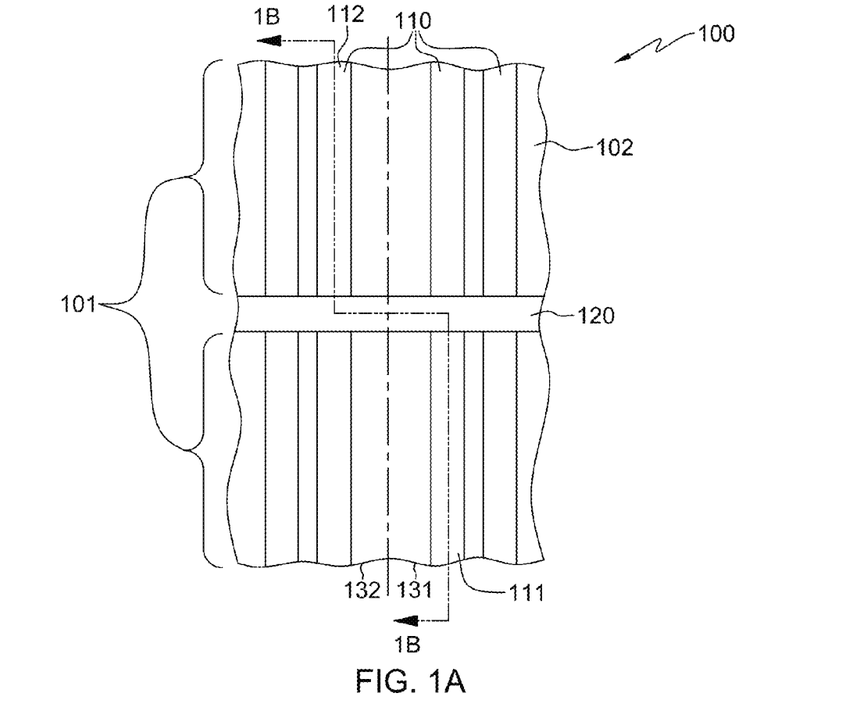
FIG. 1A is a plan view of one embodiment of an intermediate circuit structure obtained during circuit fabrication, and illustrates a gate structure extending over multiple fins of a substrate structure, in accordance with one or more aspects of the present invention.

FIG. 1A is a plan view of one embodiment of an intermediate circuit structure 100, obtained during a circuit fabrication process, in accordance with one or more aspects of the present invention. In this example, circuit structure 100 includes a substrate structure 101, which may include a substrate 102 with multiple fins 110 extending therefrom. Fins 110 may include, for example, one or more fins 111 located in a first region 131 of circuit structure 100, and one or more fins 112 located in a second region 132 of circuit structure 100. Using the processing discussed herein, for instance, with respect to FIGS. 1G-1N, at least one first transistor may be provided in first region 131 (including fin(s) 111) of circuit structure 100, and at least one second transistor may be provided in the second region 132 (including fin(s) 112) of circuit structure 100. By way of example, the at least one first transistor may be at least one first conductivity-type transistor and the at least one second transistor may be at least one second conductivity-type transistor. As is known, the different transistor conductivity-types may be one of, for example, n-type or p-type. In addition, the first conductivity-type may be a specific concentration of n-type or p-type charge carriers, while the second conductivity-type may be a different concentration of the same or different n-type or p-type charge carriers.

Substrate 102 may be (in one example) a bulk semiconductor material such as a bulk silicon wafer. As another example, substrate 102 may include any silicon-containing substrate including, but not limited to, silicon (Si), single crystal Si, polycrystalline Si, amorphous Si, Si-on-nothing (SON), Si-on-insulator (SOI), or Si-on-replacement insulator (SRI) substrates and the like, and may be n-type or p-type doped. Substrate 102 might be, for instance, approximately 600-700 micrometers thick, as one example. As noted above and as depicted in FIG. 1A, substrate structure 101 may include fins 110 which extend above substrate 102 of substrate structure 101.

By way of example, fins 110 may be formed by removing one or more portions of substrate 102, thereby creating one or more fins 110 from the same material as substrate 102, such as, for example, a semiconductor or crystalline material. In another example, formation of fins 110 may be achieved by patterning substrate 102 using various approaches, including: direct lithography; sidewall image transfer technique; extreme ultraviolet lithography (EUV); e-beam technique; litho-etch litho-etch; or litho-etch litho-freeze. Following patterning, removal may be performed, for example, by any suitable etching process, such as an anisotropic dry etching process, for instance, reactive-ion-etching (RIE) in sulfur hexafluoride ($SF_6$). Although the following numbers are relative and the heights could vary, as one specific example, fins 110 may have a height of about 40 nanometers, and a length of about one micrometer, several micrometers, or the diameter of the entire wafer, while the thickness of fins 110 may be approximately 10 nanometers or less.

Continuing with reference to FIG. 1A, one or more gate structures 120 may extend over substrate structure 101, including over fins 110, and may overlap fins 110 in selected areas or regions to operate as, for instance, the gates of multiple fin-type transistors, such as one or more fin field-effect transistors (FinFETs). In addition, the different regions where gate structure(s) 120 overlaps substrate 102 may be defined, using, for example, lithographic patterning, as one or more gates of planar FETs, such as metal-oxide-semiconductor field-effect transistors (MOSFETs). Gate structure(s) 120 may include, for instance, sacrificial gate structures, such as polycrystalline silicon (polysilicon) sacrificial gates, which are to be removed and replaced with replacement metal gates as part of a gate-last fabrication process, or may be final gate structures formed, for instance, as part of a gate-first fabrication process. Final gate structures may include one or more dielectric layers, and one or more metal layers, including work-function metal layers. Gate structure(s) 120, which may include one or more conformal structures overlying fin 110, and possibly substrate 102, may be formed using any suitable deposition process, such as atomic layer deposition (ALD), chemical vapor deposition (CVD), physical vapor deposition (PVD), or the like.

Figure 1B:
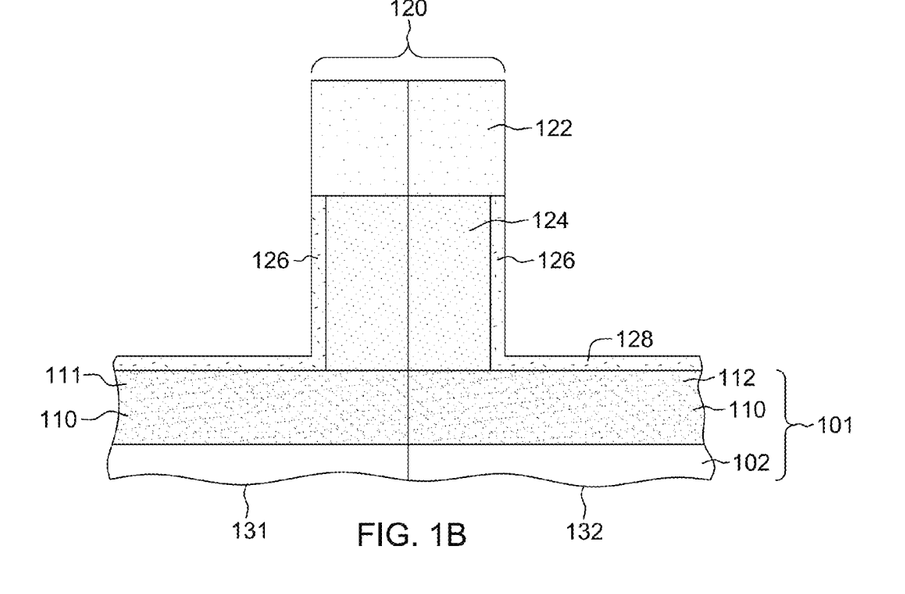
FIG. 1B is a split cross-sectional elevation view of the structure of FIG. 1A, taken along line 1B-1B thereof, illustrating the gate structure thereof extending over the multiple fins of the substrate structure, in accordance with one or more aspects of the present invention.

FIG. 1B is a split cross-sectional elevation view of the circuit structure of FIG. 1A, taken along line 1B-1B thereof, and illustrating gate structure 120 extending over a first fin 111 in first region 131, and extending over a second fin 112 in second region 132. In one embodiment, gate structure 120 includes a capping layer 122 overlying and protecting a sacrificial gate 124 and sidewall spacers 126. Sidewall spacers 126 may be adjacent to sacrificial gate 124, and a fin protect layer 128 may conform to and surround fins 110 (including fin 111 and fin 112).

Capping layer 122, sidewall spacers 126, and fin protect layer 128, facilitate, for example, various aspects of one or more circuit fabrication approaches. For example, in one embodiment, an upper portion of capping layer 122 may act as an etch-stop layer or mask, as described with reference to FIG. 1E, by physically blocking etching from reaching sacrificial gate 124 and sidewall spacers 126. In an additional example, capping layer 122, in conjunction with sidewall spacers 126, may completely or partially surround sacrificial gate 124, thereby preventing or limiting unwanted epitaxial growth from sacrificial gate 124 during, for example an epitaxial growth process in another region of the circuit, such as epitaxial growth of one or more embedded stress elements described below with respect to FIGS. 1I & 1M. Prevention of outward growth would be needed when sacrificial gate 124 is a material, such as polysilicon, susceptible to an epitaxial growth process used elsewhere in the circuit structure fabrication. In another embodiment, sidewall spacers 126 may facilitate self-aligned cavity formation within fins 110 adjacent to gate structure 120, which is useful during formation, for example, of sources or drains of FinFET or planar FET devices. As another example, fin protect layer 128 may prevent unwanted fin etching, material deposition, or epitaxial growth from fins 110 during different transistor fabrication processing steps.

Capping layer 122, sidewall spacers 126, and fin protect layer 128 may be, in one example, a common material, while in other examples, they may be different materials. Specifically, in one example, capping layer 122 may include silicon, and may be an oxide, an oxynitride, an oxycarbon, a carbonitride, etc. For instance, capping layer 122 may be or include silicon oxide, silicon nitride, silicon oxycarbon nitride, silicon boron carbonitride, silicon oxynitride, silicon boron oxycarbon nitride, or silicon oxycarbide. Capping layer 122, sidewall spacers 126, and fin protect layer 128 may be deposited using conventional deposition processes, such as, for example, CVD, low-pressure CVD, or plasma-assisted CVD (PE-CVD). In one exemplary process, silicon nitride may be deposited using process gases such as, for example, dichlorosilane ($SiH_2Cl_2$) and ammonia ($NH_3$) and using known process conditions.

Figure 1C:
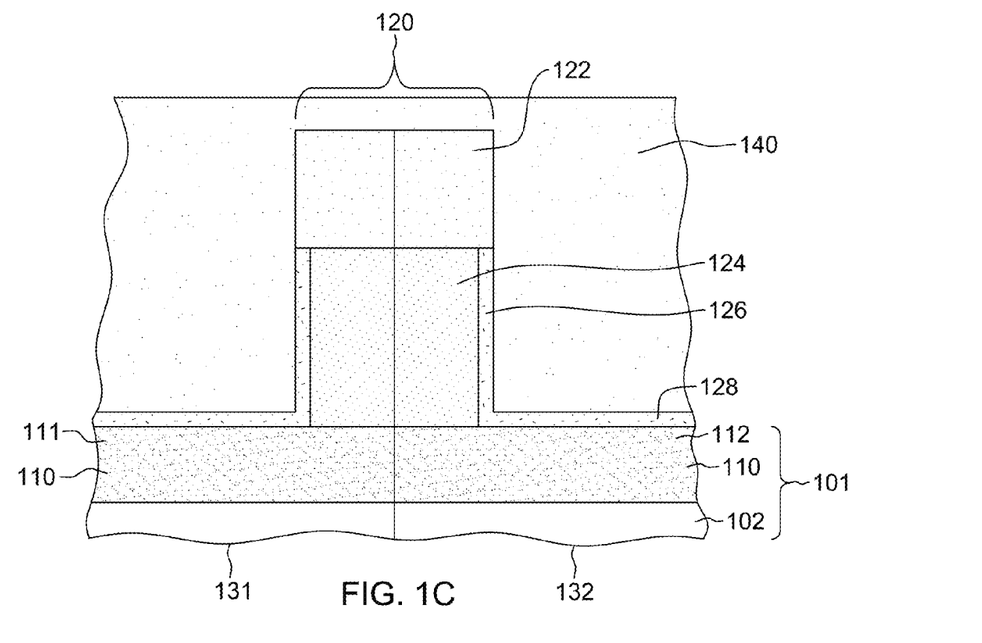
FIG. 1C depicts the structure of FIG. 1B after providing a protective mask over the gate structure, in accordance with one or more aspects of the present invention.

FIG. 1C illustrates the structure of FIG. 1B after providing a protective mask 140 over the structure, including over gate structure 120 and substrate structure 101, including multiple fins 110 and substrate 102, and fin protect layer 128. Protective mask 140 may be, for instance, an organic planarization layer (OPL) such as a siloxane-based material, which is commercially available from Honeywell International, Inc., Tempe, Ariz., under the name DUO™. This layer may have a thickness of (for example) 50 to 100 nanometers, and could be deposited using a variety of techniques, including spin-on deposition. In one embodiment, protective mask 140 may be a material that is susceptible to, for example, a dry reactive ion etching (RIE) in a manner similar to, for example, silicon dioxide or silicon nitride.

Figure 1D:
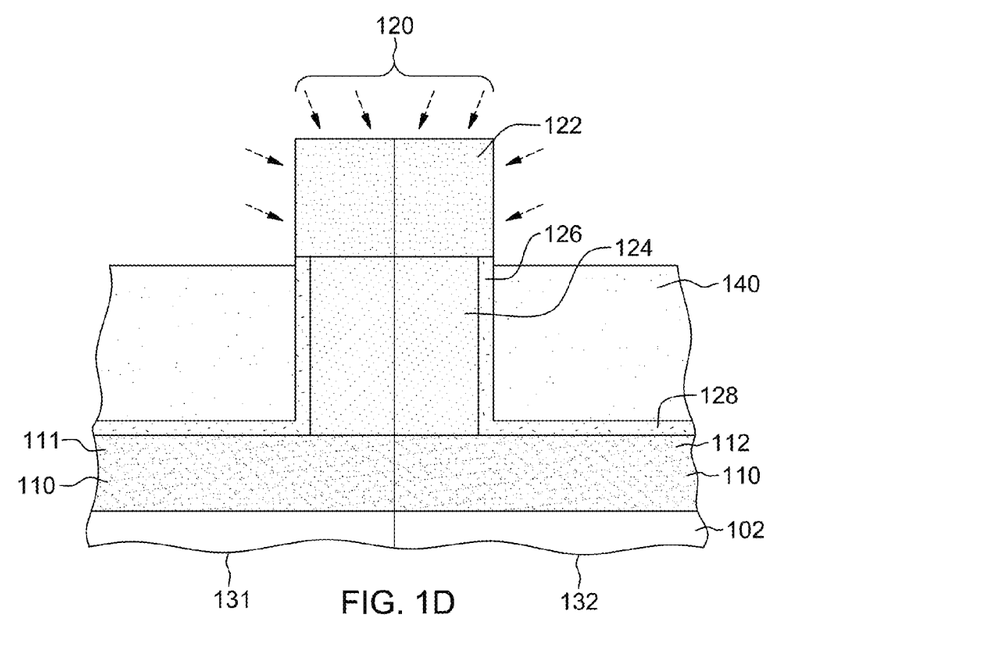
FIG. 1D depicts the structure of FIG. 1C after recessing the protective mask to expose the capping layer of the gate structure, and modifying an etch property of at least a portion of the capping layer, in accordance with one or more aspects of the present invention.

FIG. 1D illustrates the structure of FIG. 1C after recessing protective mask 140 to expose an upper portion of capping layer 122 of gate structure 120 to facilitate modifying an etch property of the at least the upper portion of capping layer 122. One or more etching processes, such as RIE, may be performed to recess protective mask 140. In one embodiment, notwithstanding the mask recessing, underlying portions of gate structure 120 (including sacrificial gate 124), as well as fins 110, and fin protect layer 128, continue to be covered by protective mask 140.

The exposed upper portion of capping layer 122 may be subjected to one or more of several different modification processes in order to modify an etch property of the capping layer 122. After the modification processing, the modified etch property of at the least the upper portion of capping layer 122 resists or inhibits etching of capping layer 122 during, for instance, one or more first and second subsequent etchings in different regions of the circuit structure. For instance, the modified etch property is designed to prevent etching of gate structure 120 during a first etch process (see FIG. 1L) used in fabrication of a first conductivity-type transistor, for example an n-type transistor, in first region 131, and prevents etching of gate structure 120 during a second etch process (see FIG. 1H) used in fabrication of a second conductivity-type transistor, for example a p-type transistor, in second region 131. In this manner, planarity of the capping layer is maintained which eliminates processing steps that may otherwise be needed to continue with the circuit fabrication process.

Modification of the etch property means that a material that would have previously been susceptible to etching under specific process parameters, for example, a specific etchant chemistry, may no longer be as susceptible to etching, and therefore may not be removed during the etch process using that chemistry. This modifying of the etch property of the portion of capping layer 122 may be achieved via one or more processes, performed either separately or together. The portion of capping layer 122 with a modified etch property may include an upper portion, such as a surface portion or layer of capping layer 122, or the modified portion may penetrate deeper into capping layer 122, including potentially the entirety of capping layer 122.

In one example, modifying the etch property may include implanting at least one species of element or molecule into capping layer 122 to modify its etch property. Assuming use of one or more of the above-noted capping layer materials, the at least one species of element or molecule may include, for example, at least one of germanium, boron, phosphorous, oxygen, ozone, carbon, nitrogen, or arsenic. The specific species of element or molecule to be implanted may be selected based upon the capping layer and the etch process (es) to be resisted. For instance, capping layer 120 may include silicon nitride, and modifying the etch property of the portion of capping layer 120 may include implanting germanium into the silicon nitride of capping layer 122. Specific property modification process parameters may vary depending upon the material of capping layer 122 and the element or molecule being implanted. In one specific example, ion implantation of the element or molecule, such as germanium, into capping layer 120, takes place at an energy level of between, for example, 1 to 15 kilo electron volts (KeV), with an implant dosage ranging from $10^{14}$ to $10^{15}$ ions/cm$^2$. In another embodiment, arsenic or phosphorous, for example, may be ion-implanted into capping layer 120 at an energy level of 2 to 3 KeV, with an implant dosage of approximately $1-1.6\times10^{15}$ ions/cm$^2$. Alternately, for example, boron may be ion-implanted at an energy level of approximately 3 KeV with an implant dosage of close to $1.5-2\times10^{15}$ ions/cm$^2$. Such processes may, for example, lead to modification of a thickness of capping layer 122 of approximately 1 to 10 nanometers. After ion implantation, capping layer 122 may be thermally treated to repair any damage to the structure caused by ion implantation, such as, for example, heat treatment at 500°-700° C. for approximately 4 minutes.

In another example, modifying the etch property of the portion of capping layer 122 may include exposing capping layer 122 to a plasma, which may include, for instance, carbon or nitrogen, to modify the etch property. In one example, capping layer 122 may be treated with N$_2$/H$_2$ plasma (including, for instance, carbon) with a power of approximately 750-800 watts (W), a N$_2$/H$_2$ flow rate of, for instance, 450 standard cubic centimeters per minute (sccm), and a radio frequency (RF) of between approximately 325 kilohertz (kHz) and 375 megahertz (MHz). The timing of the plasma treatment may, for example, be controlled in accordance with the thickness of the portion of capping layer 120, and may, for example, range between 1 and 35 seconds.

Other methods of modifying the etch property of the portion of capping layer 122 may include exposing capping layer 122 to microwave radiation, or annealing capping layer 122 in the presence of a material, for example a gaseous material including oxygen, nitrogen, or ammonia. In one embodiment, capping layer 122 may be exposed to gaseous oxide, followed by a rapid thermal anneal, at a temperature of 900° C. for approximately 15 seconds. In another example, in a lower temperature process, capping layer 122 may be exposed to steam including nitrogen, and heated to 500° C. for approximately 3 hours. An alternate process, referred to as a spike annealing process, may be performed in the range of 1000°-1100° C. for between 2 and 10 seconds, in the presence of various gaseous or solid materials, such as ammonia, nitrogen, oxygen, or silicon dioxide.

In other examples, microwave radiation may be used to heat capping layer 122 in the presence of a material, which could be a gaseous material. As known, microwave electromagnetic radiation may have wavelengths, for instance, ranging in the micrometer, millimeter, or meter ranges, and may advantageously heat an entire volume of material, rather than only heating the surface. In one process example, capping layer 122 is surrounded with, for example, nitrogen gas, and microwave radiation with a center frequency of 5.8 GHz is applied at a power level of approximately 1700 W, for a duration of between 30 seconds and 2 minutes.

Figure 1E:
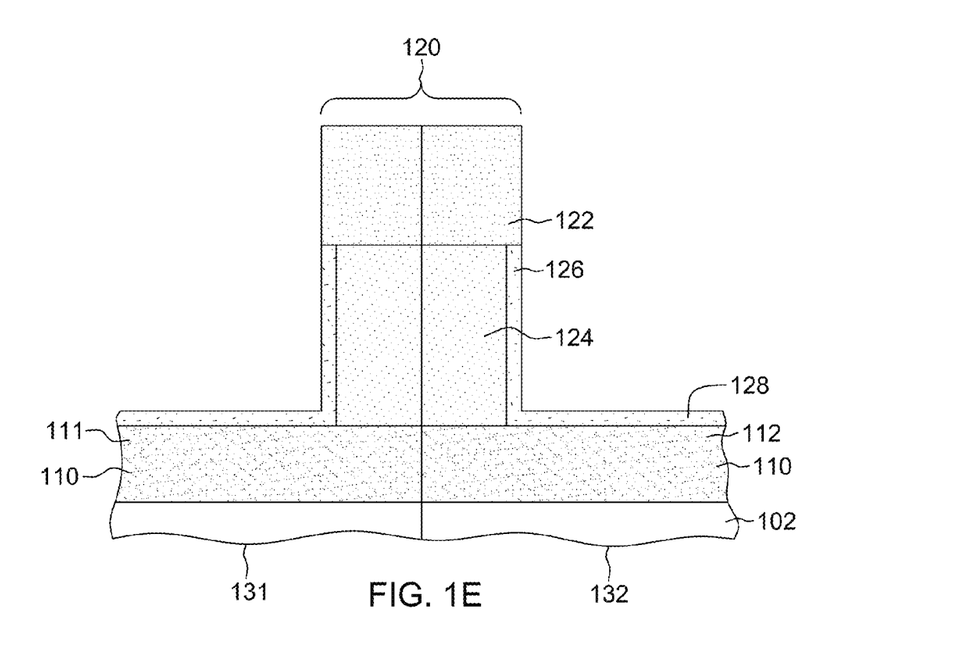
FIG. 1E depicts the structure of FIG. 1D after removing the remaining protective mask, in accordance with one or more aspects of the present invention.

FIG. 1E illustrates the structure of FIG. 1D after removing the remaining protective mask 140 (FIG. 1D). This may be accomplished via a wet or dry etch at a concentration ratio that would not remove, for example, silicon, silicon dioxide, or silicon nitride, such as by a dilute hydrofluoric (HF) acid bath of, for instance, 0.5%-5%, or a solvent based on alcohol.

Figure 1F:
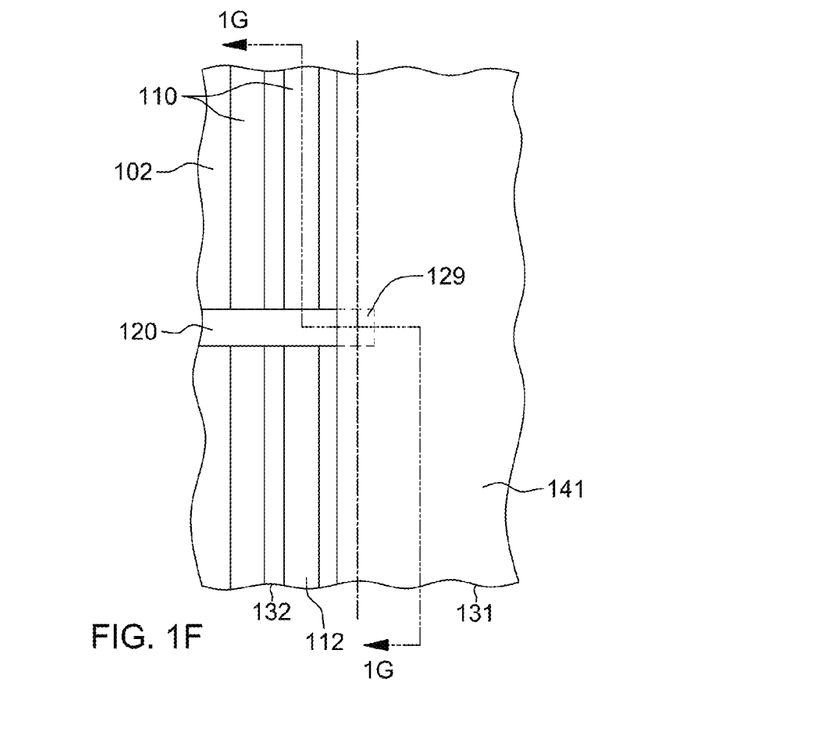
FIG. 1F is a plan view of the structure of FIG. 1E after providing a first protective layer over a first region of the circuit structure, in accordance with one or more aspects of the present invention.

FIG. 1F is a plan view of the structure of FIG. 1E after providing a first protective layer 141 over first region 131 of circuit structure 100, including fin 111 (FIG. 1A). First protective layer 141 may have any of the properties described above with respect to protective mask 140 (FIGS. 1C & 1D), and may serve to protect first region 131 from undesired etching, material deposition, or growth during fabrication of, for instance, one or more fin-type transistors, within second region 132 of the structure, as described below with respect to FIGS. 1G-1I. In one example, and as depicted, first protective layer 141 may overlap a portion of second region 132, helping to define a protected boundary portion 129 of gate structure 120 at the interface of the different regions. Such an overlap may be caused by, for example, imprecision of photolithography techniques used to position first protective layer 141.

Figure 1G:
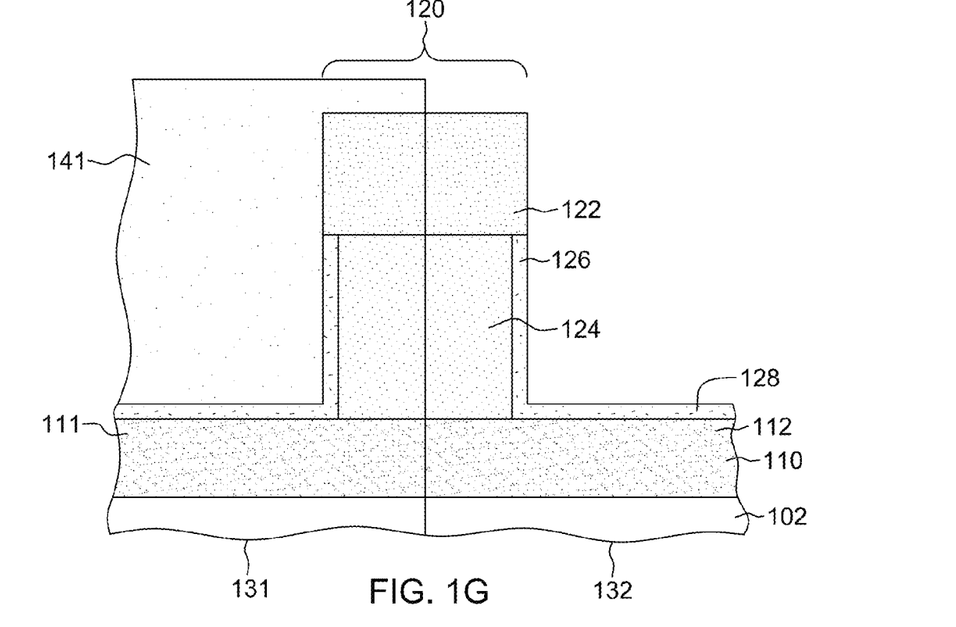
FIG. 1G depicts the structure of FIG. 1F, taken along line 1G-1G thereof, in accordance with one or more aspects of the present invention.

FIG. 1G illustrates the structure of FIG. 1F, taken along line 1G-1G thereof. First protective layer 141 may, for instance, cover fin(s) 111 of first region 131, leaving exposed fin(s) 112 of second region 132. In one embodiment, first protective layer 141 may prevent etching of structures within first region 131, including fin(s) 111, while the modified etch property of capping layer 122 is tailored or designed to prevent or inhibit etching of capping layer 122 in second region 132, during fabrication of, for example, transistor devices (including fin-type transistors) in second region 132, and thereby facilitate maintaining planarity of the capping layer between the exposed and unexposed regions.

Figure 1H:
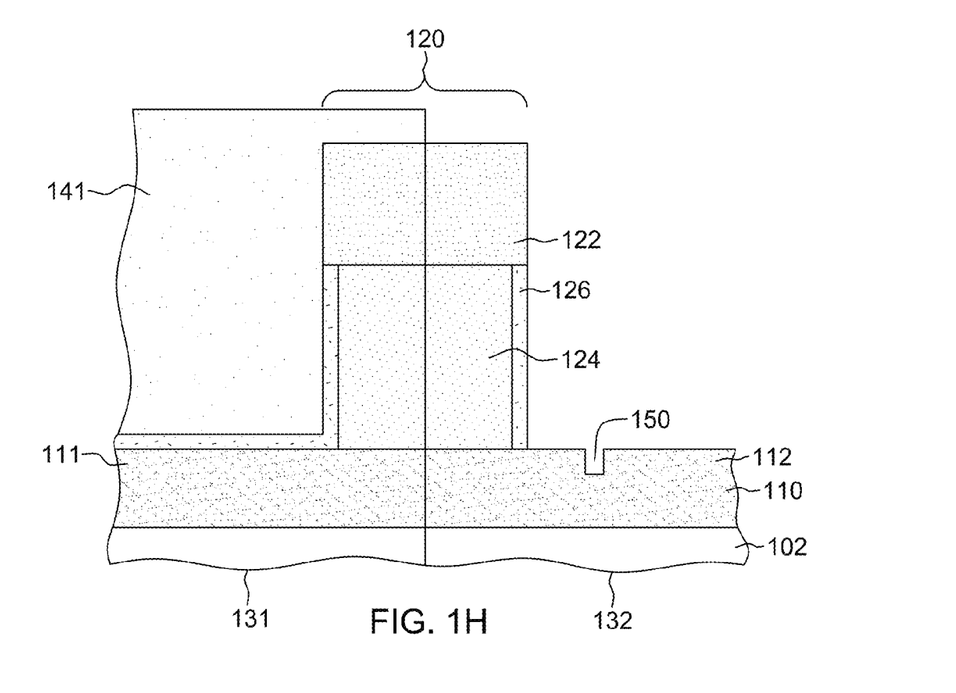
FIG. 1H depicts the structure of FIG. 1G after performing one etch process in the second region thereof to facilitate fabrication of at least one transistor therein, in accordance with one or more aspects of the present invention.

FIG. 1H illustrates the structure of FIG. 1G after performing one or more etch processes in second region 132. In one example, the etch process(es) may remove fin protect layer 128 and a portion of fin 112 of second region 132 to form one or more cavities 150, which are, for example, be configured and positioned to accommodate a source or drain of a fin-type transistor, such as a FinFET. In the embodiment depicted, etching of capping layer 122 is prevented or at least significantly inhibited by the modification of the etch property of capping layer 122. For example, the etch property may be modified so that the etchant used in the etch process will react very slowly, or not at all, with exposed material of capping layer 122.

As one specific example, substrate 102 and fins 110 may each be or include silicon, and the etch property of capping layer 122 may be modified, for instance, by implanting the capping layer with germanium. In such a case, etching in a gas mixture such as, for example, tetrafluoromethane ($CF_4$), sulfur hexafluoride ($SF_6$), or boron chloride ($BCl_2$), may etch the materials which contain silicon, such as substrate 102 and fins 110, approximately 70 to 100 times faster than the materials containing germanium, such as the modified upper portion of capping layer 122. In another example, substrate 102 and fins 110 may each include germanium, and the etch property of the capping layer may have been modified by, for example, annealing or microwave treatment of capping layer 122 to form silicon nitride or silicon oxide therein. In such a case, low-pressure plasma etching with fluorine, chlorine, or bromine, may etch the materials which include germanium, such as, for instance, substrate 102 or fins 110, 40 to 100 times faster than materials not containing germanium, such as, for instance, capping layer 122. In either of the examples, the etching could be, for example, anisotropic etching.

Figure 1I:
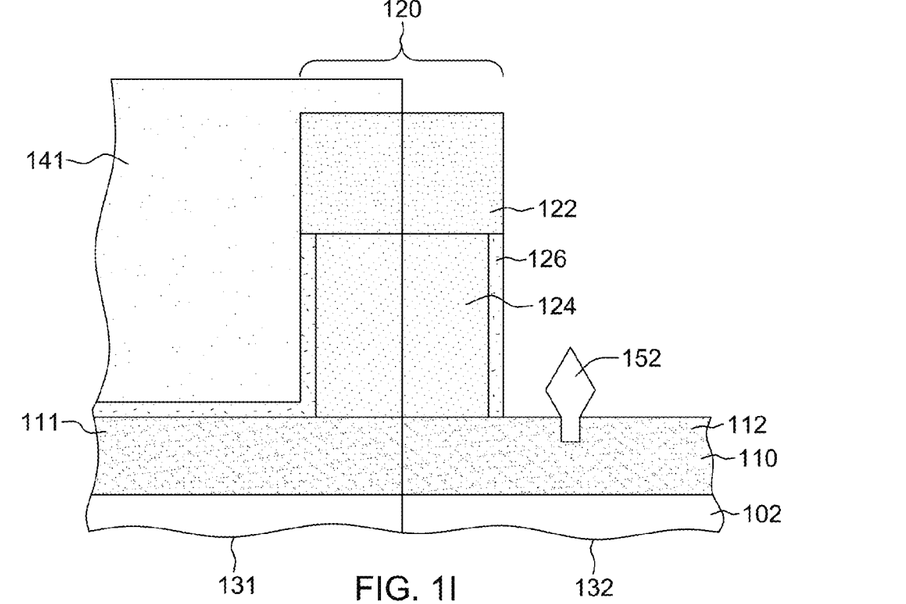
FIG. 1I depicts the structure of FIG. 1H after providing an at least partially embedded stress element in the second region, in accordance with one or more aspects of the present invention.

By way of further example, FIG. 1I illustrates one or more structures which may be provided during fabrication of, for instance, fin-type transistors, in second region 132. In the embodiment depicted, an embedded stress element 152 is provided within cavity 150 (FIG. 1H). For instance, embedded stress element 152 may be formed by epitaxially growing the element from exposed surfaces of cavity 150, that is, after masking other portions of fin 112. Embedded stress element 152 may be epitaxially grown using selective epitaxial growth via various methods, such as, for example, chemical vapor deposition (CVD), low-pressure CVD (LPCVD), or other applicable methods. A suitable material for embedded stress element 152 may be chosen depending on the type of transistor being fabricated. For example, silicon germanium (SiGe) with, for example, 10-50% germanium doping, may be used to achieve compressive stress for p-type transistors, while silicon carbon (SiC) or silicon phosphide (SiP) with, for example, 0.1-10% doping, may be used to achieve tensile stress for n-type transistors.

Advantageously, because the modified etch property of capping layer 122 is tailored or designed to resist or inhibit etching of capping layer 122, it is less likely that the one or more previous etch processes inadvertently exposed one or more surfaces of sacrificial gate 124. Therefore, the risk of undesirable formation of epitaxial growths, from sacrificial gate 124, during this epitaxial growth process for the source and/or drain is avoided.

As another advantage, the modified etch property of capping layer 122 could, for example, facilitate the use of a more aggressive etching, including increased durations or using greater chemical concentrations, to for instance facilitate removing substantially all of fin protect layer 128 (FIG. 1H) from a source or drain area of fin 112 adjacent to gate structure 120. Such aggressive etching to achieve full fin protect layer 128 removal from the source and drain area helps to minimize defective epitaxial growth of embedded stress element 152, for instance, around unwanted remnants of fin protect layer 128.

Figure 1J:
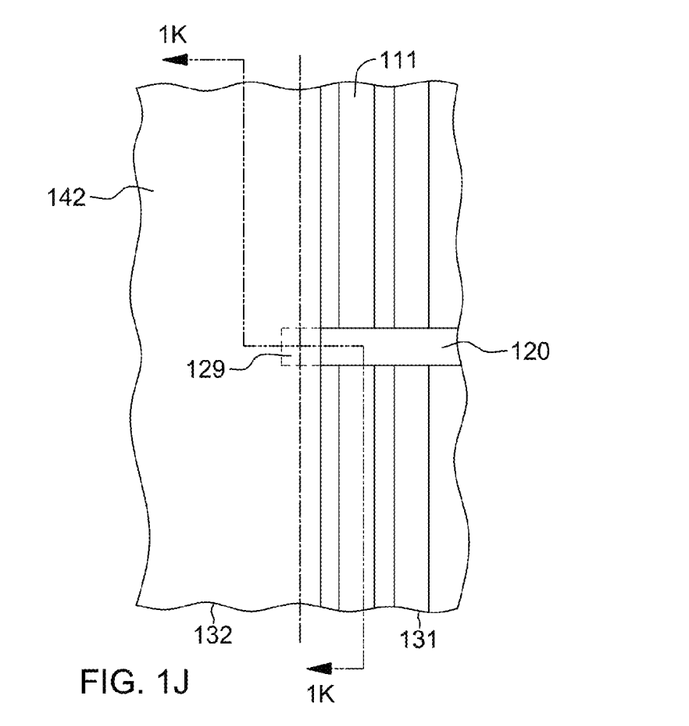
FIG. 1J is a plan view of the structure of FIG. 1I after removing the first protective layer over the first region and providing a second protective layer over the second region, in accordance with one or more aspects of the present invention.

FIG. 1J is a plan view of the structure of FIG. 1I after removing first protective layer 141 from over first region 131 and providing a second protective layer 142 over second region 132. Second protective layer 142 may again have any of the properties previously described with respect to first protective layer 141 (see FIG. 1F), and may serve to protect second region 132 during fabrication of, for instance, one or more fin-type transistors within first region 131. As depicted, in one example, second protective layer 142 may overlap a portion of first region 131, thereby again overlapping boundary portion 129 of gate structure 120, for example, due to imprecision of photolithography techniques used to position second protective layer 142.

Figure 1K:
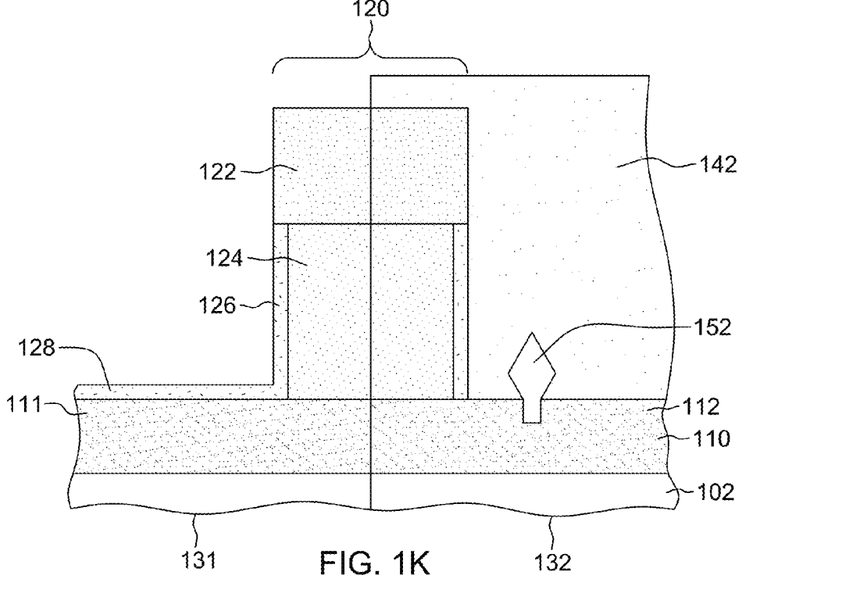
FIG. 1K depicts the structure of FIG. 1J, taken along line 1K-1K thereof, in accordance with one or more aspects of the present invention.

FIG. 1K illustrates the structure of FIG. 1J, taken along line 1K-1K thereof. As shown, second protective layer 142 may, for instance cover fin(s) 112 of second region 132, leaving exposed fin(s) 111 of first region 131. In one embodiment, second protective layer 142 may prevent etching of second region 132, including fin(s) 112, while the modified etch property of capping layer 122 is designed to inhibit etching of capping layer 122 in first region 131, during fabrication of, for example, transistor devices (including fin-type transistors) in first region 131, and thereby facilitate maintaining planarity of the capping layer between the exposed and unexposed regions.

Figure 1L:
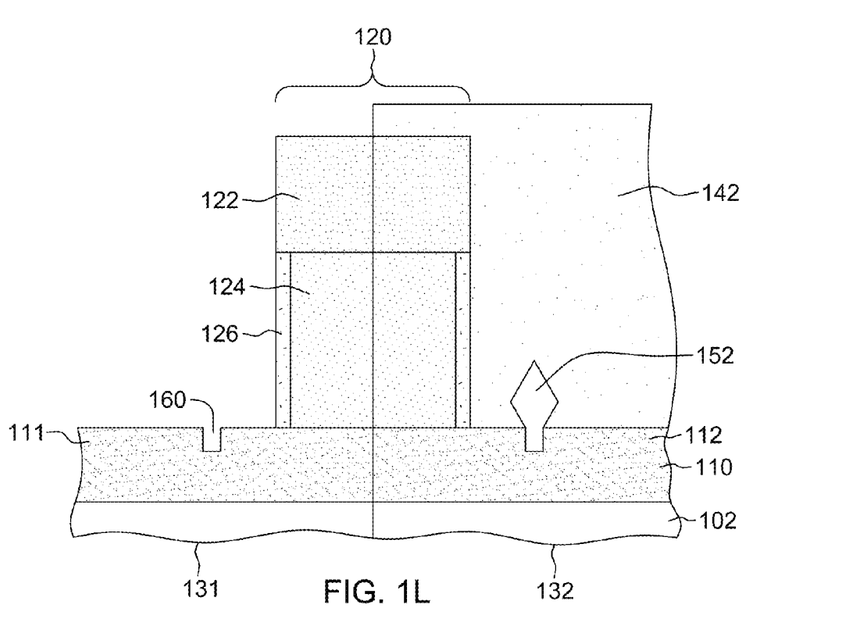
FIG. 1L depicts the structure of FIG. 1K after performing another etch process in the first region thereof to facilitate fabrication of at least one transistor therein, in accordance with one or more aspects of the present invention.

FIG. 1L illustrates the structure of FIG. 1K after performing one or more etch process(es) in first region 131. In one example, the etch process(es) may remove fin protect layer 128 and a portion of fin 111 of first region 132 to form one or more cavities 160. Boundary portion 129, or at least a portion thereof, may have been overlapped by both first protective layer 141 (FIG. 1F) during the first etch process and second protective layer 142 during the second etch process. Notwithstanding the one or more first etch process(es) and the one or more second etch process(es), the modified etch property of capping layer 122 is designed to facilitate maintaining planarity of capping layer 122, by preventing capping layer 122 from being thinned during etching due to its modified etch property. By contrast, in the absence of the modified etch property, overlapping of boundary portion 129 by both protective layers could result in an undesirable height variation of capping layer 122, with boundary portion 129 having a greater height than the rest of capping layer 122, after the non-uniform etching processes.

Figure 1M:
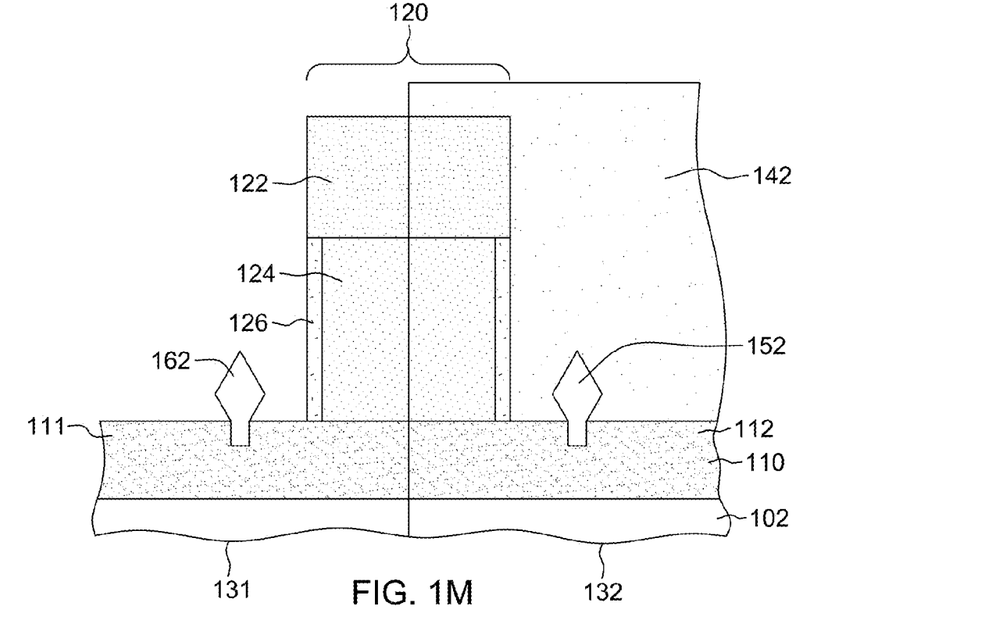
FIG. 1M depicts the structure of FIG. 1L after providing an at least partially embedded stress element in the first region, in accordance with one or more aspects of the present invention.

By way of specific example, FIG. 1M illustrates one or more structures which may be provided during fabrication of, for instance, fin-type transistors, in first region 131. In the embodiment depicted, an embedded stress element 162 may be provided within cavity 160 (FIG. 1L). Embedded stress element 162 may be formed, and may have characteristics, as previously described with respect to embedded stress element 152 (FIG. 1I).

Figure 1N:
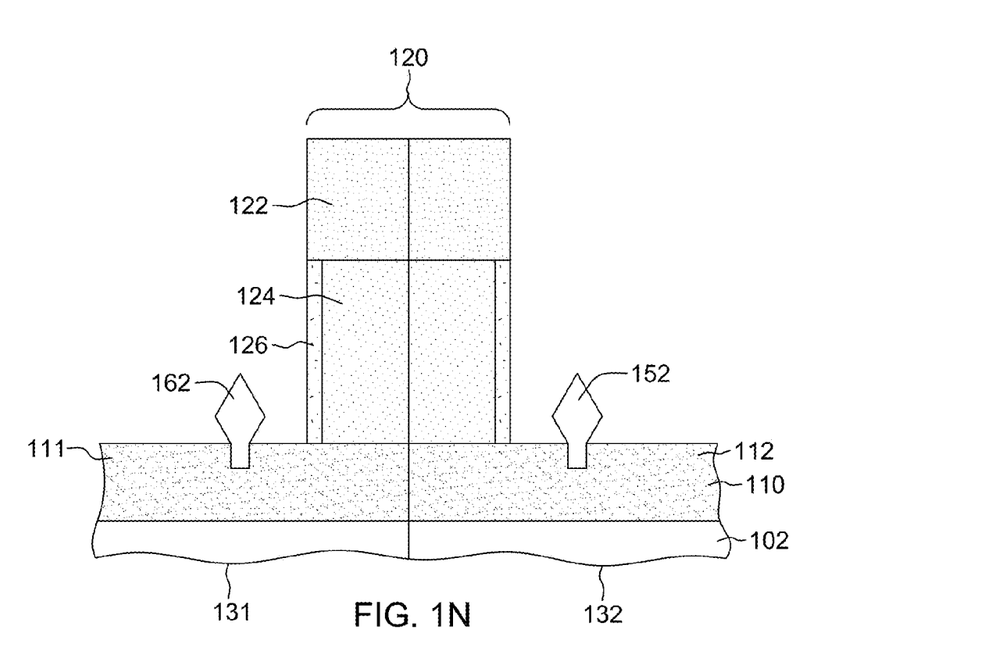
FIG. 1N depicts the structure of FIG. 1M after removing the second protective layer over the second region, in accordance with one or more aspects of the present invention.

FIG. 1N illustrates the structure of FIG. 1M after removing second protective layer 142 over second region 131. As depicted, a first fin-type transistor, in first region 131, may include a portion of gate structure 120 and a source or drain, which includes embedded stress element 162, while a second fin-type transistor, in second region 132, may include a portion of gate structure 120 and a source or drain, which includes embedded stress element 152. In a replacement gate, or gate-last fabrication process, capping layer 122 may be subsequently removed to expose sacrificial gate 124. Because of the modified etch property of capping layer 122, a specific etch chemistry, to which capping layer 122 remains susceptible, must be chosen to remove capping layer 122. Uniformity of height, or planarity, of capping layer 122, may facilitate the gate-last process, because capping layer 122 and sacrificial layer 124 may be removed without accounting for variations of height, thus potentially eliminating or decreasing the scope of one or more processing steps.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   facilitating fabricating a circuit structure, the facilitating fabricating comprising:
      providing the circuit structure with at least one gate structure extending over a first region and a second region of a substrate structure, the at least one gate structure comprising a capping layer; and
      modifying an etch property of at least a portion of the capping layer of the at least one gate structure, wherein the modified etch property inhibits etching of the capping layer during a first etch process facilitating fabrication of at least one first transistor in the first region and inhibits etching of the at least one gate structure during a second etch process facilitating fabrication of at least one second transistor in the second region.

2. The method of claim 1, wherein modifying the etch property of the at least the portion of the capping layer comprises implanting at least one species of element or molecule into the capping layer to modify the etch property thereof.

3. The method of claim 2, wherein the at least one species of element or molecule comprises at least one of germanium, boron, phosphorous, oxygen, ozone, carbon, nitrogen, or arsenic.

4. The method of claim 1, wherein modifying the etch property of the at least the portion of the capping layer comprises exposing the capping layer to a plasma to modify the etch property thereof.

5. The method of claim 4, wherein the plasma comprises at least one of carbon or nitrogen.

6. The method of claim 1, wherein modifying the etch property of the at least the portion of the capping layer comprises exposing the capping layer to microwave radiation in the presence of a gaseous material to modify the etch property thereof.

7. The method of claim 6, wherein the gaseous material comprises at least one of oxygen or nitrogen.

8. The method of claim 1, wherein the modifying the etch property of the at least the portion of the capping layer comprises annealing the capping layer in the presence of a gaseous material to modify the etch property thereof.

9. The method of claim 8, wherein the gaseous material comprises at least one of nitrogen or oxygen.

10. The method of claim 1, wherein the capping layer comprises at least one of silicon oxide, silicon nitride, silicon oxycarbon nitride, silicon boron carbonitride, silicon oxynitride, silicon boron oxycarbon nitride, or silicon oxycarbide.

11. The method of claim 1, wherein the capping layer comprises silicon nitride and the modifying the etch property of the at least the portion of the capping layer comprises implanting germanium into the silicon nitride of the capping layer.

12. The method of claim 1, wherein the at least one gate structure further comprises a sacrificial gate and sidewall spacers, the sidewall spacers being adjacent to the sacrificial gate, and the capping layer overlying the sacrificial gate and the sidewall spacers, wherein the modified etch property of the at least a portion of the capping layer prevents etching of the sacrificial gate and the sidewall spacers during the first etch process and the second etch process.

13. The method of claim 12, wherein the first etch process comprises a first anisotropic etching and the second etch process comprises a second anisotropic etching.

14. The method of claim 13, further comprising removing the sacrificial gate subsequent to the first etch process and the second etch process, wherein the modified etch property of the capping layer facilitates maintaining planarity of the capping layer prior to the removing of the sacrificial gate notwithstanding the different first and second etch processes.

15. The method of claim 1, wherein the modifying the etch property of the at least the portion of the capping layer of the at least one gate structure comprises:
   providing a protective mask extending over the at least one gate structure;
   recessing the protective mask to expose the capping layer of the at least one gate structure;

modifying the etch property of the at least a portion of the capping layer of the at least one gate structure; and removing the protective mask.

16. The method of claim 15, wherein the modifying the etch property of the at least a portion of the capping layer comprises at least one of implanting at least one species of element or molecule into the capping layer, exposing the capping layer to a plasma, exposing the capping layer to microwave radiation in the presence of a gaseous material, or annealing the capping layer.

17. The method of claim 1, wherein the substrate structure comprises multiple fins, the first region and the second region including different regions of the multiple fins, and the at least one first transistor in the first region comprises at least one first fin-type transistor, and the at least one second transistor in the second region comprises at least one second fin-type transistor.

18. The method of claim 17, wherein providing the circuit structure further comprises providing a fin protect layer over the multiple fins, the fin protect layer and the capping layer comprising a common material susceptible to the first and second etch processes, and modifying the etch property of the at least the portion of the capping layer comprises modifying the etch property of the at least the portion of the capping layer without effecting an etch property of the fin protect layer over the multiple fins, wherein the modified portion of the capping layer inhibits etching of the at least one gate structure during the first and second etch processes, and the fin protect layer over the multiple fins remains susceptible to the first and second etch processes.

19. The method of claim 18, wherein the fabrication of the first fin-type transistor comprises:

performing the first etch process to remove a portion of the fin protect layer to reveal a portion of the multiple fins in the first region; and growing at least one an embedded stress element from the portion of the multiple fins in the first region.

20. The method of claim 1, wherein the at least one gate structure comprises a boundary portion overlapping the first region and the second region, and the first etch process comprises, prior to etching, providing a protective layer over the second region of the circuit structure and the boundary portion of the at least one gate structure, and the second etch process comprises, prior to etching, providing another protective layer over the first region of the circuit structure and the boundary portion of the at least one gate structure, and wherein the modified etch property of the capping layer facilitates maintaining planarity of the capping layer, including the boundary portion, notwithstanding the different first and second etch processes.

* * * * *